(12) United States Patent
Cyril

(10) Patent No.: US 6,489,173 B1
(45) Date of Patent: Dec. 3, 2002

(54) METHOD FOR DETERMINING LEAD SPAN AND PLANARITY OF SEMICONDUCTOR DEVICES

(75) Inventor: Alvin P. Cyril, Selangor (MY)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/832,762

(22) Filed: Apr. 11, 2001

(51) Int. Cl.$^7$ ................................................ G01R 31/26
(52) U.S. Cl. ........................................ 438/14; 356/375
(58) Field of Search ................................ 356/375, 621; 438/14; 428/457

(56) References Cited

U.S. PATENT DOCUMENTS 5,309,223 A * 5/1994 Konicek ..................... 365/375

* cited by examiner

*Primary Examiner*—John F. Niebling
*Assistant Examiner*—Andre' C Stevenson
(74) *Attorney, Agent, or Firm*—W. James Brady, III; Frederick J. Telecky, Jr.

(57) ABSTRACT

A method for detecting and screening integrated circuit devices having all leads in a row out of planarity specification wherein the leads are deformed at the same angle is described. The method enables existing top-view visual inspection systems to accurately measure the lead span of multiple leads on a plurality of good devices from a product lot, calculate the planarity and tolerances, measure the lead span of each device under test, and from the lead span differences calculate the planarity, and screen devices which are outside the defined tolerances. Technical advantages of this recursive computational procedure assure capture of failed devices having a previously undetectable fault without exceeding the manufacturing capability and specification for the particular device.

9 Claims, 3 Drawing Sheets

US 6,489,173 B1

METHOD FOR DETERMINING LEAD SPAN AND PLANARITY OF SEMICONDUCTOR DEVICES

FIELD OF THE INVENTION

This invention relates generally to the field of electronic devices, and more particularly, to a method for inspecting the planarity of semiconductor circuit package leads.

BACKGROUND OF THE INVENTION

Integrated circuit packages have leads that connect external circuitry to the internal integrated circuits. The leads are formed generally of a metal conductor such as copper, or an iron alloy, and are cut and formed to a shape and dimension specified by the device type. If the integrated circuit device leaves the manufacturing process with any leads which are deformed and are unable to make good contact with the printed circuit board (PCB), an open or intermittent circuit often results.

A final inspection of the device is generally carried out at the manufacturing site prior to shipment in order to avoid costly failures, or additional inspection, with resulting work slow down at the user or PCB assembly site. In high volume semiconductor manufacturing sites, automated visual inspection systems, such as that illustrated in FIG. 1, are made by way of a computer based image processor 20 connected to a CCD camera 21. A top view inspection system requires only a single camera 21, and has the capability of inspecting devices 22 for parameters such as lead pitch, missing or extra leads, linearity, lead span, top side symbolization, and to some extent for lead planarity. Planarity failures occur when one or more leads are lifted either up or down so that the flat portion of the lead tip is unable to make contact with a seating plane below the device body. Top view inspection systems measure the distance a particular lead extends in comparison to a normal line of leads in a row, and to a set tolerance. More complex and expensive systems with multiple cameras are required if all aspects of lead planarity are to be inspected.

Adding more complexity to final lead inspection is the fact that many plastic packaged semiconductor devices are transported, stored, and assembled onto printed circuit boards from an embossed carrier tape, and the final inspection must be made after the device is situated in the carrier recess 23. The carrier tape has become a predominant means of transport because it permits mounting of the electronic components to a PCB to be accomplished with increased efficiency, and facilitates handling of components, in particular semiconductor packages having fine pitch gull wing shaped leads.

In carrier tape format, each semiconductor device is positioned in a recess formed on a tape at predetermined intervals in a longitudinal direction, and the recess is covered by a thin film of tape which is adhered to the embossed carrier by an adhesive to close the opening. The final inspection carried out prior to shipment is made with the devices positioned in the carrier tape recess or pocket prior to cover tape positioning and sealing. However, it is not possible to make side-view inspection of devices in the recesses, and as a result some types of planarity failures are not detected by automated top-view inspection.

Planarity defects are significant because out of plane leads may result in continuity failures at printed circuit board (PCB) assembly. Fine pitch leads are typically composed of a highly ductile metal, such as copper and are readily deformed during handling processes. Final inspection of a device positioned in a carrier recess allows detection of errors recognizable from a top-view only. A planarity failure recognizable from the top view is a lead 25 which is lifted from its seating plane 26, as illustrated in FIGS. 2a and 2b. Clearly, the lead 25 is out of line from its neighboring leads 24.

However, a planarity defect not recognized by top view inspection is one in which all leads in one row are lifted, or lowered uniformly from the seating plane 36 at the same angle, as illustrated in FIGS. 3a and 3b. From an end view, as in FIG. 3a, the defective leads 35 are readily distinguished from the correctly formed and seated leads 34, but from a top view, as shown in FIG. 3b, this defect is undetected because all the shiny metallic leads in a row appear to be uniform, and non-planarity is overlooked.

In particular, this defect will not be detected in devices situated in a tape or other carrier having a recessed pocket. Further, one cause of this defect has been traced to the device loading process itself, as illustrated in FIG. 4, wherein a leaded device 40 is slightly misplaced in a tape carrier pocket 41, and the mechanical track cover 43 forces the device into its pocket, bending all leads 45 caught against the recess wall. In this example, the leads are all deformed upward, and at a uniform angle. Another mechanism leading to failures involving all leads at a uniform angle occurs when small semiconductor devices are forced into the receiving carrier by a jet of air, which may force a device positioned on its side to deform all leads on that row. Alternate carrier types include trays which have recesses in which the semiconductor devices are placed for shipment and mounting. As with carrier tapes, inspection is made from the top view, and may not detect some types of planarity failures.

It would be a significant advantage to the industry if a solution to this planarity defect analysis deficiency could be found, and in particular if the analysis would make use of existing lower cost top-view imaging systems, and if it were applicable to final inspection of devices within a carrier.

SUMMARY OF THE INVENTION

In accordance with the present invention, the problem of failure to detect non-planarity of multiple leads having the same offset angle from an integrated circuit package is resolved.

It is an object of the present invention to provide a sensitive, and accurate method for detecting lead planarity defects using top-view automated inspection equipment.

It is an object of the present invention to provide a method for analyzing lead planarity of semiconductor devices which have been placed in embossed carrier tape, or alternate recessed carrier format.

It is an object of the invention to provide a method for inspecting gull wing leaded devices.

It is further an object of the invention to provide a method for analysis of lead planarity which does not exist on current inspection systems.

It is an object of the invention to make use of existing vision inspection equipment.

It is an object of the invention to provide a method for analysis of lead planarity defects which avoids over compensation resulting in rejection of devices beyond the capability of manufacturing equipment.

The above objectives are realized by a new method for calculating lead planarity based on measured lead span, obtained from use of existing top-view visual inspection systems. The lead span of multiple leads on a predetermined number of good devices from a specific production lot are accurately measured, a mathematical model of the device defined, and the tolerances of the lot calculated. The lead span of each device under test in the production lot is then measured, and from the differences in lead span between the known good devices and the device under test, the planarity is calculated from a relationship between span and height above the seating plane, and any devices which are outside the defined tolerances are screened. Technical advantages of this recursive computational procedure assure capture of failed devices having a previously undetectable fault without exceeding the manufacturing capability, and specification for the particular device type.

In a preferred embodiment, thin small outline (TSSOP) plastic packages housed in an embossed carrier tape are characterized, and tolerances defined using the aforementioned method.

DETAILED DESCRIPTION OF THE FIGURES, METHOD, AND EQUATIONS

Figure 1:
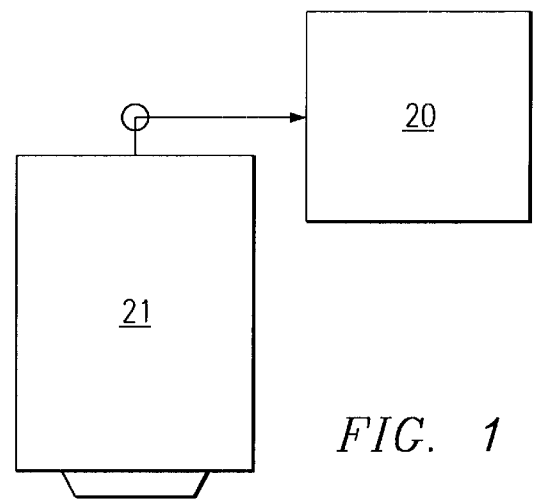
FIG. 1 illustrates major components of a top-view visual inspection system. (Prior art)
Figure 2A:
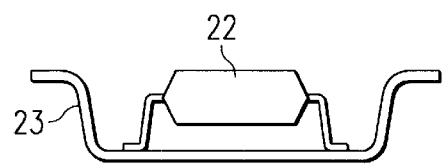
FIG. 2a is an example of a typical lead planarity failure from an end view. (Prior art)
Figure 3A:
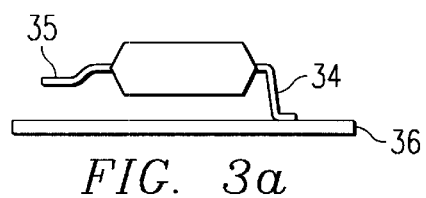
FIG. 3a is an end view of a device having all leads on one row out of plane at the same angle. (Prior art)
Figure 2B:
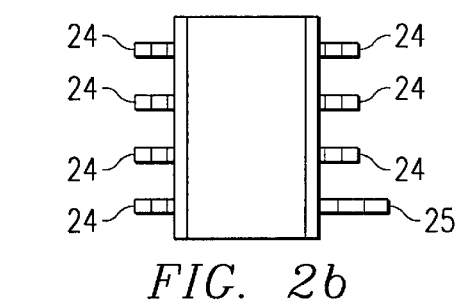
FIG. 2b is an example of a typical lead planarity failure from a top view. (Prior art)
Figure 3B:
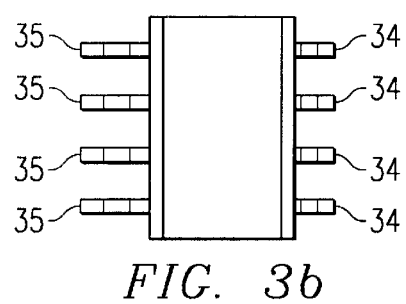
FIG. 3b is a top view of a device having all leads on one row out of plane at the same angle. (Prior art)
Figure 4:
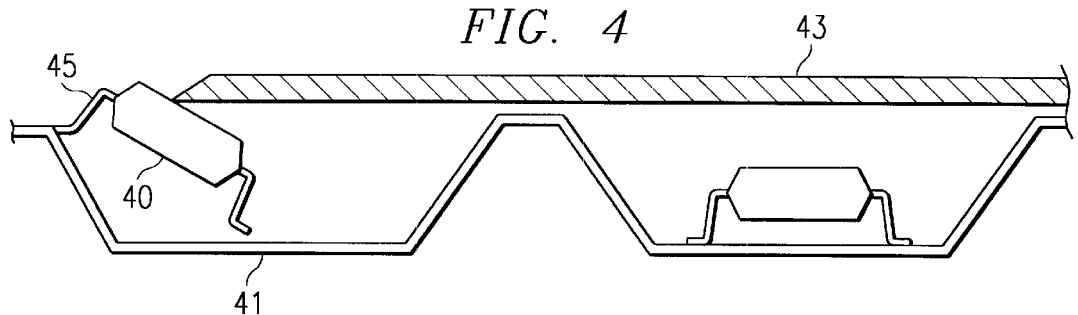
FIG. 4 illustrates a potential mechanism for deforming multiple leads on one row. (Prior art)

FIGS. 2a, 2b, 3a and 3b are examples of lead planarity failures in semiconductor packaged devices. The defect in FIGS. 2a and 2b is readily visible from a top-view vision system, while that in FIGS. 3a and 3b is not discernible. However, both types of defects are very likely to cause continuity failures when the devices are assembled on a PCB. The analysis and detection method of this disclosure is concerned with failures, such as those in FIGS. 3a and 3b, wherein all leads on one row of a parallel row of leads are out of plane, and are displaced from the seating plane by the same angle.

Figure 5A:
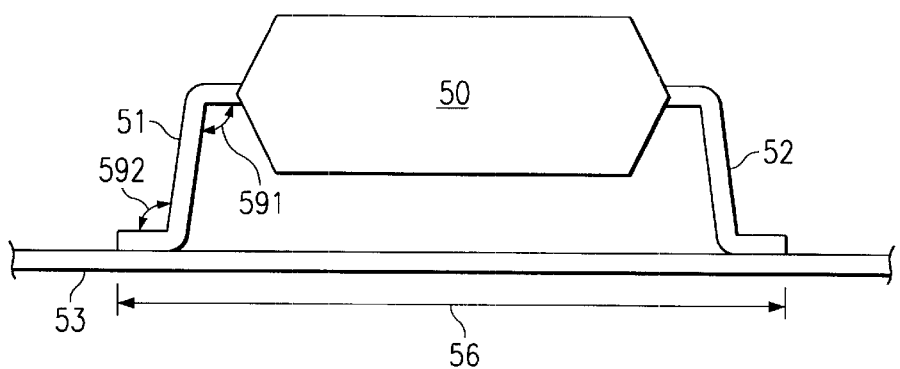
FIGS. 5a, 5b, and 5c are mechanical models of the change in lead span and planarity before and after leads are deformed according to the current invention.
Figure 5B:
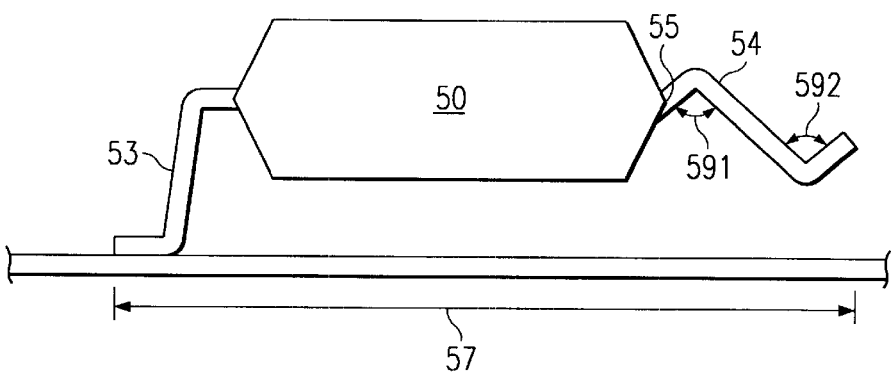

FIG. 5a is a mechanical model of semiconductor package 50 having gull wing leads 51 and 52, which are correctly formed and seated, and have a lead span of a dimension 56. Lead span is defined as the distance from tip to tip of leads in parallel rows, or effectively is the device width. This parameter is readily detected and analyzed by top-view vision systems, but because the primary intent is control of overall package width, the tolerance is relatively loose. FIG. 5b is a model of a package with the same lead design, but having leads in row 54 removed from the seating plane, and positioned at a different angle with respect to the package body 50 from those in row 53. The lead span of this device is dimension 57, and appears from the top view to be greater than the lead span 56 of the device in FIG. 5a.

Figure 5C:
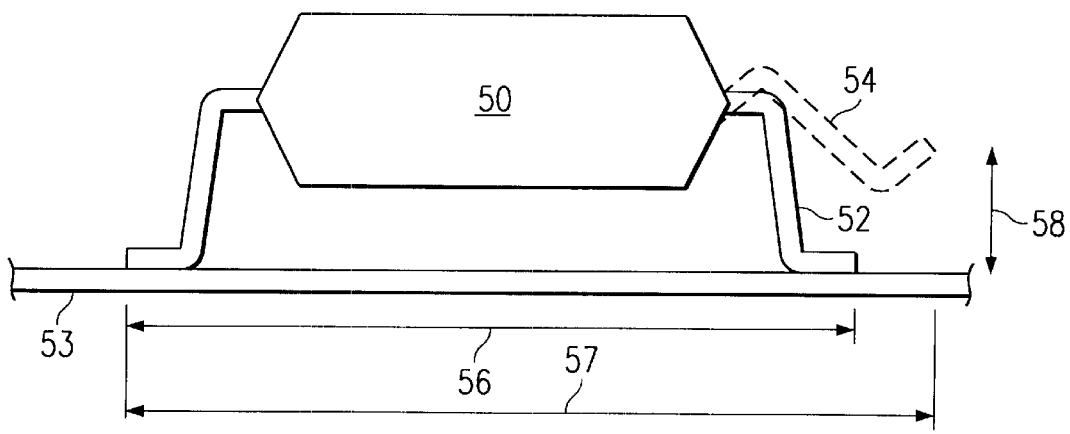

The formed angles 591 and 592 of leads are not changed in the type of planarity failures wherein all leads are bent at the same angle, but instead the deformation is initiated at point 55, where the lead exits the package body. In FIG. 5c, the illustrations from FIGS. 5a and 5b are overlaid, and the comparison of leads 52 and 54 clearly shows that not only is there a difference in the lead span 56 and 57, but also there is a distance 58 of lead 54 from the seating plane 53. From these drawings, it is obvious that on a given device type, if there is change in lead span, and the formed angles of the leads are unchanged, there is a change in distance 58 of a lead from the seating plane. The distance 58 is the length of a planarity defect.

Figure 6:
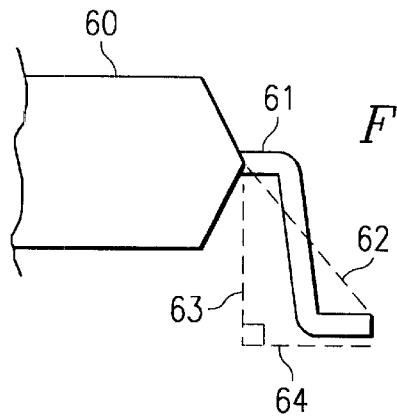
FIG. 6 is a mathematical model of a lead according to the current invention.

FIG. 6 provides a mathematical model of a lead 61 attached to a package body 60. The lead height 63, as measured at egress from the package to the seating plane is equal to parameter y, the lead length 64 is from the lead tip to a point where y intersects the seating plane, and is equal to parameter x. When the x and y relationship is depicted as a right triangle, the hypotenuse 62 is equal to a parameter z, and is bounded by the point of lead egress from the body and the lead tip. These parameters are specific to a particular device specification. The hypotenuse includes the formed angles 591 and 592, as illustrated in FIG. 5, of the particular device design, therefore the hypotenuse does not change during subsequent deformation.

Figure 7:
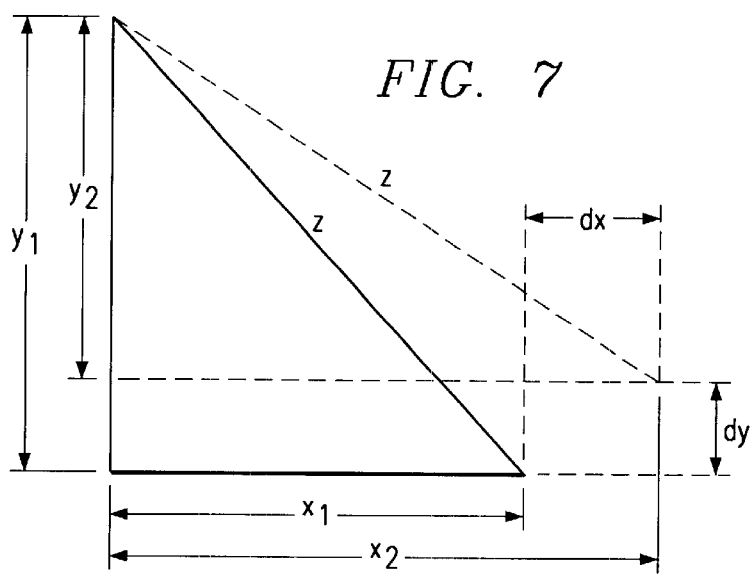
FIG. 7 is a mathematical model of a planarity defect from the current invention.

FIG. 7 provides a mathematical model of a planarity defect. The model of a correctly formed and seated lead represented by x1 and y1 is compared to the defective lead represented by x2 and y2. The hypotenuse does not change with deformation, therefore the lead tip moves in an arc, z is the radius of the arc, and has the same value in either case. The difference between x1 and x2 is dx and the difference between y1 and y2 is dy.

The relationship between the modeled leads is given in Equations 1, 2, 3 and 4. In Equation 1, Pythagorean Theorem relates the variables in FIG. 6. If equation 1 is differentiated with respect to the variable x, the resultant equation 2 would express the relation of dx and dy, as modeled in FIG. 7.

$x = \sqrt{z^2 - y^2}$      Equation 1

$dx/dy = (z^2 - y^2)^{1/2} * (-y)$      Equation 2

Using the small increment rule, an equation is derived which reflects how small changes in the y direction affect changes in the x direction, as represented in equation 3. δx and δy are equal to small changes in the x or lead span direction, and small changes in the y, or planarity direction respectively.

$\delta x / \delta y \approx dx/dy$ and $\delta x = dx/dy * \delta y$      Equation 3

By inserting equation 2 into equation 3, Equations 4a and 4b are derived, which in turn provide a "relation factor", or a ratio for a given package design.

$\delta x = \{-y/\sqrt{z^2 - y^2}\} * \delta y\}$ or relation factor $= -y/\sqrt{z^2 - y^2}$      Equation 4

The analyses were applied to a thin small outline TSSOP package, having the following dimensions and specifications in mils; with X=39.37, Y=27.56, Z=48.06, and a planarity specification of 3.5, maximum.

The relation factor for this device is calculated to be 0.7.

Inspection results before (Lead span 1) and after (Lead span 2) simulated planarity deformation are as follows:

| Lead Span 1 | Lead Span 2 | dx | dy |
|---|---|---|---|
| 248.7 | 249.3 | 0.6 | 1.2 |
| 248.8 | 250.9 | 2.1 | 2.3 |
| 248.3 | 250.6 | 2.3 | 3.5 |
| 248.6 | 251.5 | 2.9 | 4.3 |

Based on these analyses, a top-view measurable lead span change can be assigned for a given device type. However, given the tolerances of measurement equipment, and the manufacturing equipment tolerances, the analyses may result in excessive apparent failures. In particular, the lead forming equipment will have lot to lot variance, as well as within lot variance which may lead to excessive failure rates, if a fixed specification were applied wherein the specification was based on the calculated values from lead span. Therefore, in order to determine real failures, and to take into consideration the manufacturing capability, an algorithm has been derived wherein the lead span is measured, and planarity calculated according to equations 1 through 4. The result is analyzed with respect to an average of measured values from a series of known devices representing the manufacturing capability, and to the device specifications. This combination of recursive analyses provides an algorithm for accurately detecting planarity failures wherein small changes in all leads in a row of parallel leads are deformed at the same angle from the seating plane. The algorithm is included in the vision system software to allow automated detection of this particular planarity defect in a production environment.

Final inspection of packaged semiconductor devices includes lot specific data, and the first step in inspection is to teach lot information. Therefore, it is consistent with existing practice to "teach" a particular parameter such as lead span for detection and analysis of lead planarity failures wherein all leads in one row are out of planarity at the same angle. The method includes the following steps;

a) include lead span to planarity relation algorithm in the software of a top-view vision system,
  b) "teach" lead span measurement in addition to existing parameters for each device production lot,
  c) measure, analyze, and average the lead span of a prescribed number of acceptable units from the defined production lot,
  d) inspect the production lot, analyze planarity defects concurrently with other visual inspection criteria, and
  e) determine if devices under test are within the planarity criterion established for the given manufacturing lot, and for the device planarity specification.

Application of the lead span and planarity algorithm to visual inspection allows a tighter lead span tolerance than general device specifications by making use of a variable, lot dependent specification, and in turn use of the tighter specification enables screening out devices having planarity failures previously undetected.

The new method of using existing automated top-view visual inspection equipment, teaching lead span measurement, and analyzing the data for lead planarity displacement from the seating plane, providing lot variable specification based on production capability, and the ability to accurately make these inline inspections on devices positioned in pocket carriers provides a valuable addition to the reliability of finished semiconductor devices for both the product manufacturer, and the printed circuit board assembler. All these advantages are realized with little or no additional cost or cycle time to production.

It will be recognized that while the lead span and planarity algorithm have been described with respect to a given semiconductor package and gull wing lead design, the method is applicable to multiple device types, and to variations in the algorithm. It is, therefore, the intention that the appended claims be interpreted as broadly as possible.

What is claimed is:

1. A method for detecting and analyzing lead planarity in a semiconductor device having parallel rows of leads including the following steps:

a) measuring and averaging the lead span of multiple leads on a preset number of acceptable devices from a given production lot,
  b) measuring the lead span of multiple leads on a device under test,
  c) calculating the difference in lead span between the device under test and said average of lead spans from acceptable devices,
  d) calculating the distance of the leads under test from the seating plane based on the differences in lead span,
  e) comparing said distance of leads from the seating plane to the planarity specification for the device type, and to the production lot criterion set by said acceptable devices.

2. A method as in claim 1 wherein measurement of lead span is made by a top-view visual inspection system.

3. A method as in claim 1 for calculating the distance of a lead from the seating plane by construction of a mathematical model of said lead as right triangle, wherein the tip of said lead moves in an arc, and application of the small increment rule relates the change in distance from the seating plane to said measured lead span for a specific device design.

4. A method as in claim 1 wherein a variable specification for planarity is set based on lead span measurements of said acceptable devices.

5. A method as in claim 1 wherein said planarity analysis is made concurrently with inspection for multiple defect categories.

6. A method as in claim 1 wherein said semiconductor devices have gull shaped leads.

7. A method as in claim 1 wherein said semiconductor devices are positioned in a recesses carrier.

8. A method as in claim 1 wherein the ratio of differences in lead span to planarity is a function of package design.

9. A method for calculating lead planarity of a specific device type and production lot including the following:

a) calculating the hypotenuse of a triangle formed from a lead height to a seating plane and the distance from the lead tip to package egress,
  b) calculating a device specific relation factor determined by relating the lead distance from said seating plane to the lead length, and applying the small increment rule wherein a small change in lead length is equal to a small change in height times a negative change in height divided by the square root of the hypotenuse squared minus the height squared, and
  c) comparing devices under test to an average of average of acceptable leads from the defined production lot.

* * * * *